(12) United States Patent
Stockert

(10) Patent No.: US 11,581,855 B2
(45) Date of Patent: Feb. 14, 2023

(54) POWER AMPLIFIER CIRCUITRY

(71) Applicant: Qorvo US, Inc., Greensboro, NC (US)

(72) Inventor: Terry J. Stockert, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 203 days.

(21) Appl. No.: 17/126,552

(22) Filed: Dec. 18, 2020

(65) Prior Publication Data

US 2021/0194437 A1 Jun. 24, 2021

Related U.S. Application Data

(60) Provisional application No. 62/951,027, filed on Dec. 20, 2019.

(51) Int. Cl.
*H03F 1/30* (2006.01)
*H03F 1/56* (2006.01)
*H03F 3/24* (2006.01)

(52) U.S. Cl.
CPC ............... *H03F 1/302* (2013.01); *H03F 1/56* (2013.01); *H03F 3/245* (2013.01); *H03F 2200/318* (2013.01)

(58) Field of Classification Search
CPC ....................................................... H03F 1/302
See application file for complete search history.

(56) References Cited

U.S. PATENT DOCUMENTS

| 5,578,967 A * | 11/1996 | Harvey ................. H03F 3/3066 330/265 |
| 5,886,578 A * | 3/1999 | Miyashita ........... H03F 3/45076 330/253 |
| 2014/0361833 A1* | 12/2014 | Rey-Losada ........ H03F 3/45291 330/255 |
| 2015/0145604 A1* | 5/2015 | Scott ........................ H03F 1/32 330/296 |
| 2020/0091878 A1 | 3/2020 | Maxim et al. |

OTHER PUBLICATIONS

Notice of Allowance for U.S. Appl. No. 16/565,718, dated Nov. 4, 2020, 6 pages.

* cited by examiner

*Primary Examiner* — Patricia T Nguyen
(74) *Attorney, Agent, or Firm* — Withrow & Terranova, P.L.L.C.

(57) ABSTRACT

Disclosed is power amplifier circuitry having a bipolar junction power transistor with a base, a collector, and an emitter. The power amplifier circuitry includes bias correction sub-circuitry configured to generate a compensation current substantially opposite in phase and substantially equal in magnitude to an error current passed by a parasitic base-collector capacitance inherently coupled between the base and collector, wherein the bias correction sub-circuitry has a compensation output coupled to the base and through which the compensation current flows to substantially cancel the error current.

21 Claims, 11 Drawing Sheets

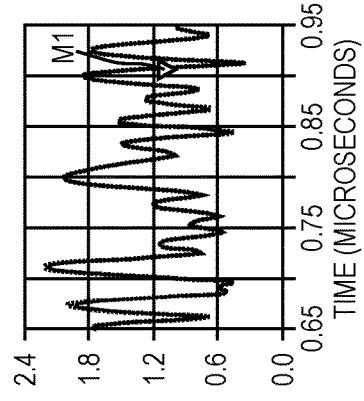
FIG. 4C
(RELATED ART)
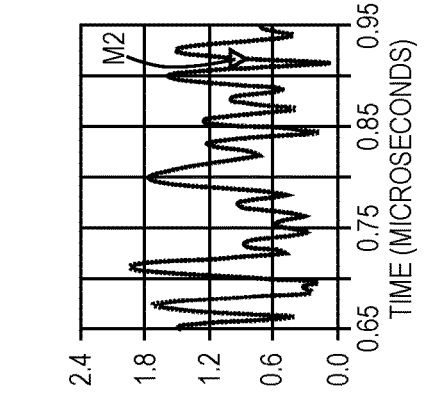
FIG. 4F
(RELATED ART)
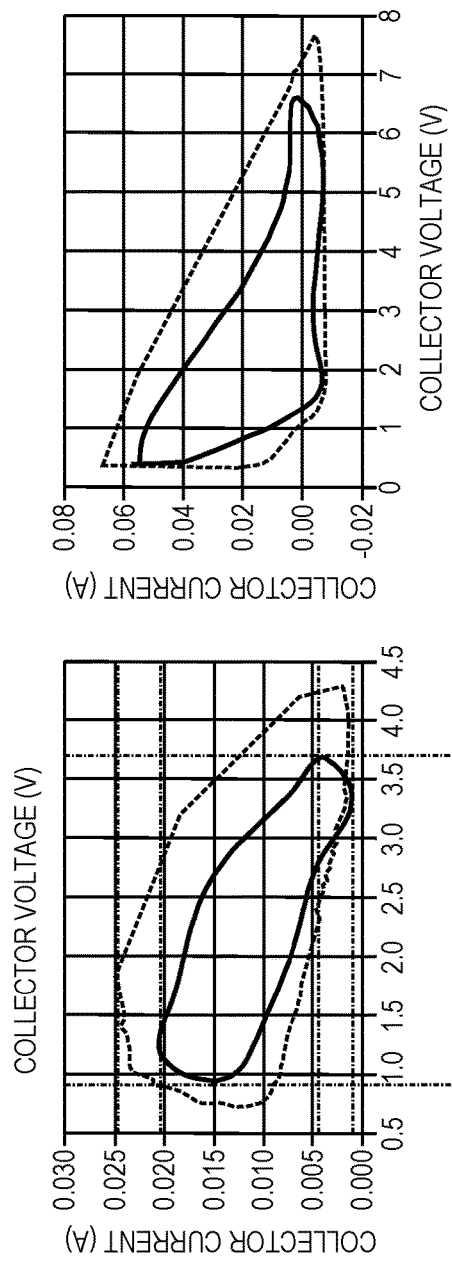
FIG. 4B
(RELATED ART)
FIG. 4A
(RELATED ART)
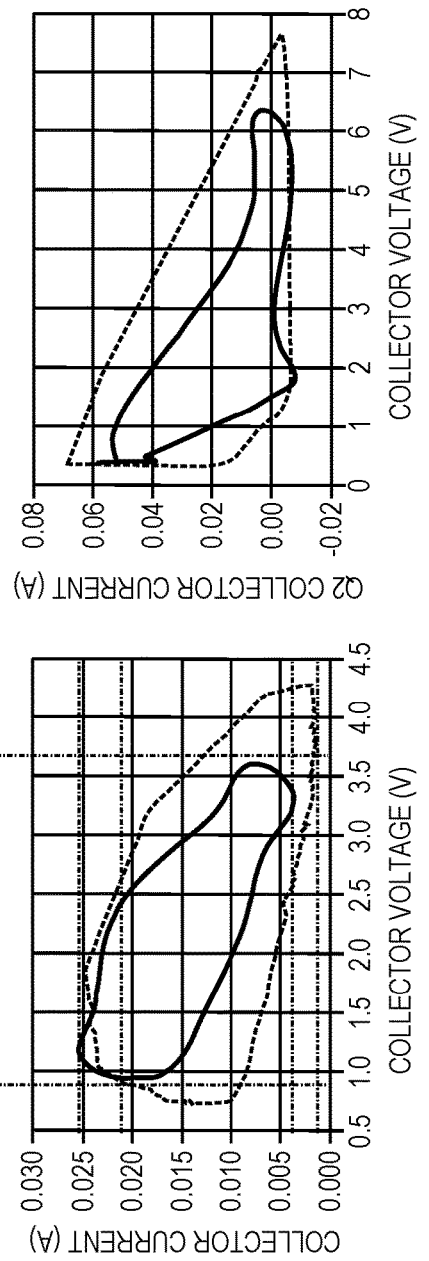
FIG. 4E
(RELATED ART)
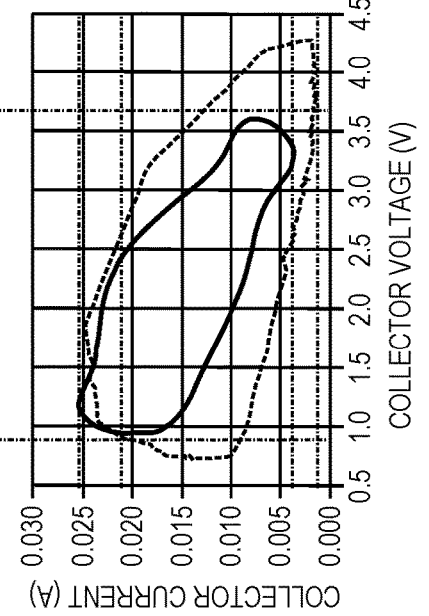
FIG. 4D
(REALTED ART)

POWER AMPLIFIER CIRCUITRY

RELATED APPLICATIONS

This application claims the benefit of provisional patent application Ser. No. 62/951,027, filed Dec. 20, 2019, the disclosure of which is hereby incorporated herein by reference in its entirety.

This application is related to U.S. patent application Ser. No. 17/126,561, filed Dec. 18, 2020, now U.S. Pat. No. 11,349,513, titled ENVELOPE TRACKING SYSTEM, the disclosure of which is hereby incorporated herein by reference in its entirety.

FIELD OF THE DISCLOSURE

The present disclosure relates to circuitry and methods to compensate for bias shifts in bipolar junction transistor-based power amplifiers.

BACKGROUND

Power amplifiers are generally biased to operate in specific classes of amplifier operation. Therefore, it is desirable to maintain bias stability during operation. However, undesirable bias shifts away from a desired range of bias points may be caused by unwanted current paths due to parasitic capacitances inherent in power cell devices such as bipolar junction power transistors that are biased to amplify wide bandwidth signals associated with envelope tracking systems. Bias shift becomes increasingly problematic as power cells increase in size to provide higher power. The bias shift is also increasingly problematic as modulation bandwidth increases because slew rate is proportional to the derivative of envelope voltage. Thus, there is need for power amplifier circuitry that is configured to compensate for undesirable bias shifts.

SUMMARY

Disclosed is power amplifier circuitry having a bipolar junction power transistor with a base, a collector, and an emitter. The power amplifier circuitry includes bias correction sub-circuitry configured to generate a compensation current substantially opposite in phase and substantially equal in magnitude to an error current passed by a parasitic base-collector capacitance inherently coupled between the base and collector, wherein the bias correction sub-circuitry has a compensation output coupled to the base and through which the compensation current flows to substantially cancel the error current.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 4A is a graph of driver transistor collector voltage versus driver transistor collector current corresponding to an in-phase/quadrature-phase magnitude of ~1 and a negative slope for the related-art power amplifier circuitry.

FIG. 4B is a graph of output transistor collector voltage versus output transistor collector current corresponding to an in-phase/quadrature-phase magnitude of ~1 and the negative slope for the related-art power amplifier circuitry.

FIG. 4C is an IQ vs. time plot showing a marker indicating the negative slope associated with the graphs of FIGS. 3A and 3B.

FIG. 4D is a graph of driver transistor collector voltage versus driver transistor collector current corresponding to an in-phase/quadrature-phase magnitude of ~1 and a positive slope for the related-art power amplifier circuitry.

FIG. 4E is a graph of output transistor collector voltage versus output transistor collector current corresponding to an in-phase/quadrature-phase magnitude of ~1 and the positive slope for the related-art power amplifier circuitry.

FIG. 4F is an IQ vs. time plot showing a marker indicating the negative slope associated with the graphs of FIGS. 3D and 3E.

DETAILED DESCRIPTION

Figure 1:
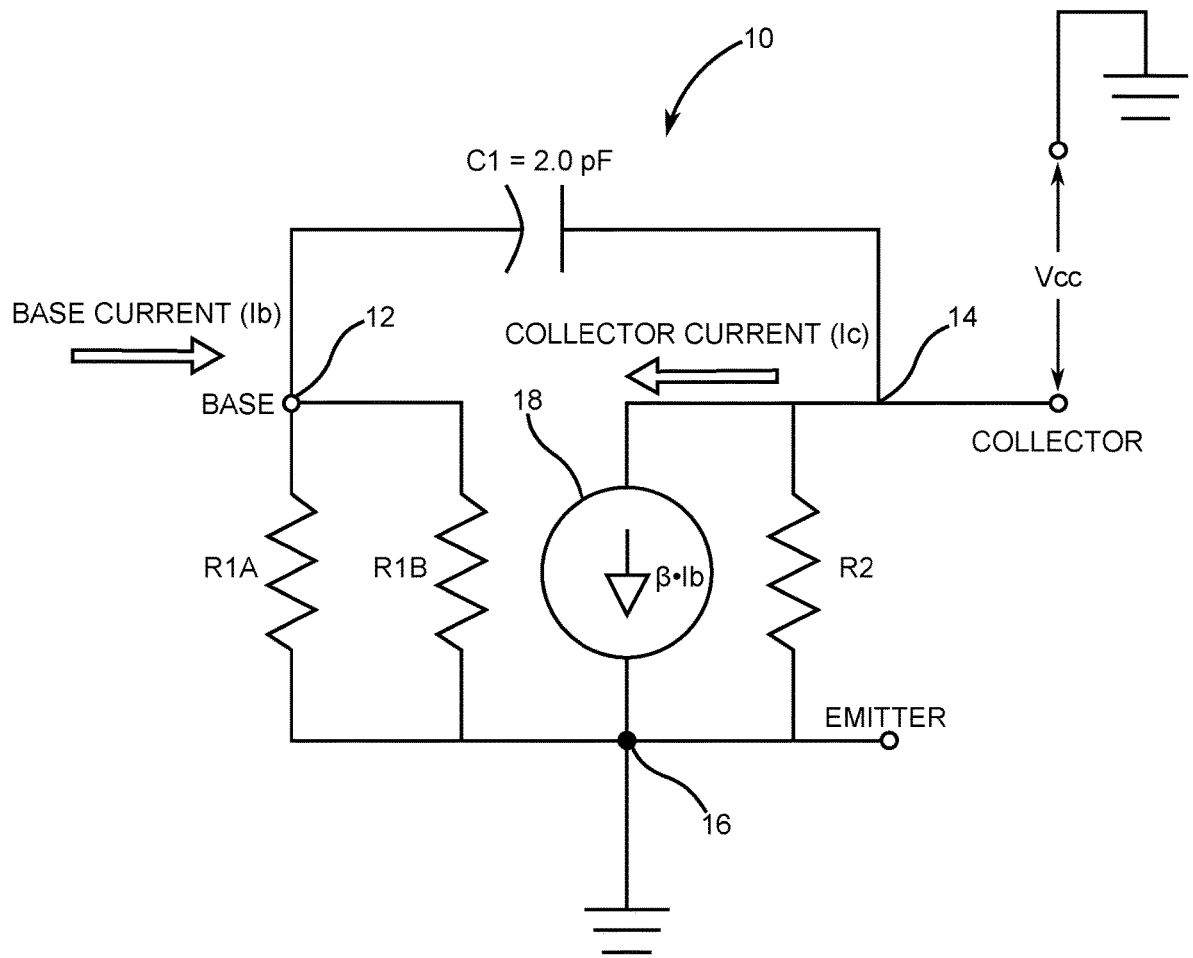
FIG. 1 is a hybrid-pi model of a bipolar junction transistor-based power cell modified with additional parasitic base-collector capacitance.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to power amplifier circuitry and methods to compensate for bias shifts in heterojunction bipolar transistor-based power amplifiers caused by collector voltage modulation. The bias shift is proportional to slew rate and base-collector capacitance inherently coupled between a base and collector. The bias shift becomes increasingly problematic as power cells of power amplifiers increase in size to provide higher power. The bias shift is also increasingly problematic as modulation bandwidth increases because slew rate is proportional to the derivative of envelope voltage. The bias shift resulting from this parasitic base-collector capacitance results in amplitude modulation-amplitude modulation error from higher gain on the leading edge and the lower gain on the trailing edge. These changes in operating point due to the bias shift are a memory effect and thus degrade linearity with larger effects as bandwidth increases. The power amplifier circuitry and methods disclosed herein generally compensate for the bias shift by sensing envelope voltage slope and injecting into the base of the power cell a compensation current that is substantially opposite in phase and substantially equal in magnitude to an error current causing the bias shift.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

As alluded to, the present disclosure relates to power amplifier circuitry and methods to compensate for bias shifts in heterojunction bipolar transistor (HBT) power amplifiers caused by collector voltage modulation. The power amplifier circuitry and methods according to the present disclosure differ from the related art as follows:

1. The power amplifier circuitry does not correct for band-limited bias effects as the compensating current is generated within the bias circuit itself and thus is passed through the direct current (DC) ballast resistance.
2. The main source of error caused by parasitic base-collector capacitance is amplitude modulation-amplitude modulation (gain) error and affects a near-class A driver stage more significantly than a final stage.

FIG. 1 is a hybrid-pi model of a bipolar junction transistor-based power cell 10 modified with additional parasitic base-collector capacitance C1. The parasitic base-collector capacitance C1 is coupled between base node 12 and a collector node 14. In this exemplary case the parasitic base-collector capacitance is modeled with 2.0 picofarads of capacitance. A base resistance is modeled by two parallel resistors R1A and R1B that are coupled between the base node 12 and an emitter node 16. Current gain of the power cell 10 is modeled by a current source 18 that multiples a current gain $\beta$ times a base current Ib to generate a collector current Ic. An output resistance R2 is coupled between the collector node and the emitter node 16. In this exemplary case, the output resistance R2 is 20Ω and the emitter node 16 is coupled to ground. Given a non-zero external node impedance at the base node 12, a parasitic current through C1 generated by a changing power supply voltage Vcc is injected into the base, adding to or subtracting from a desired base current Ib.

Note that differential power amplifiers may employ cross-neutralization to reduce the effect of parasitic base-collector capacitance at radio frequency, since each differential bank of power cells such as power cell 10 is out of phase. This creates more error at baseband, however, since each differential bank of power cells is in-phase at baseband and the cross-neutralization capacitance adds to the parasitic base-collector capacitance. The error due to both the parasitic base-collector capacitance and cross-neutralization can be compensated in the same manner.

Figure 2:
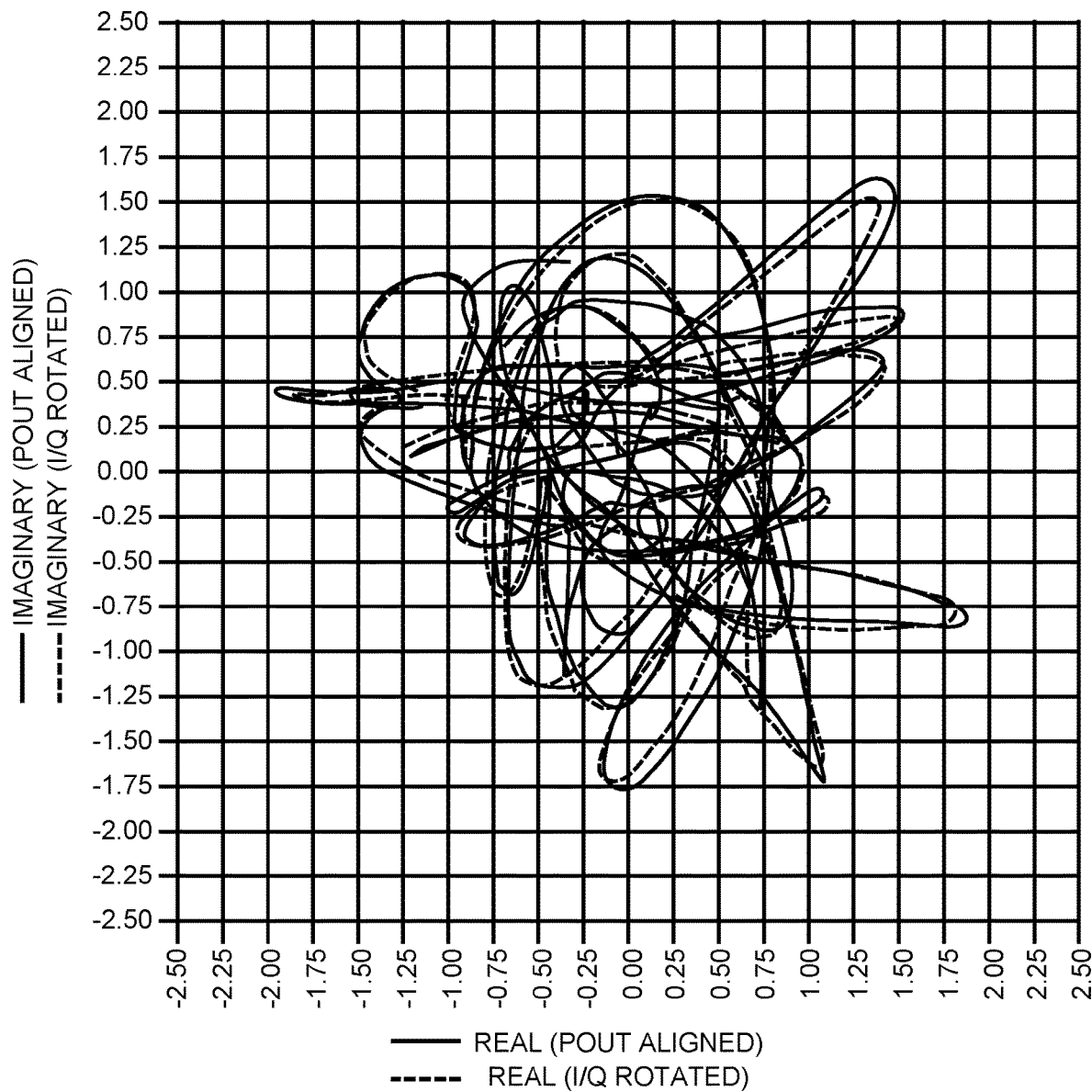
FIG. 2 is a graph of in-phase/quadrature-phase (IQ) input/output plots that are phase aligned and scaled that show degraded adjacent channel leakage ratio of −33.7 dBc when moving from 100 MHz to 200 MHz bandwidth for related-art power amplifier circuitry incorporating the power cell of FIG. 1.
Figure 3:
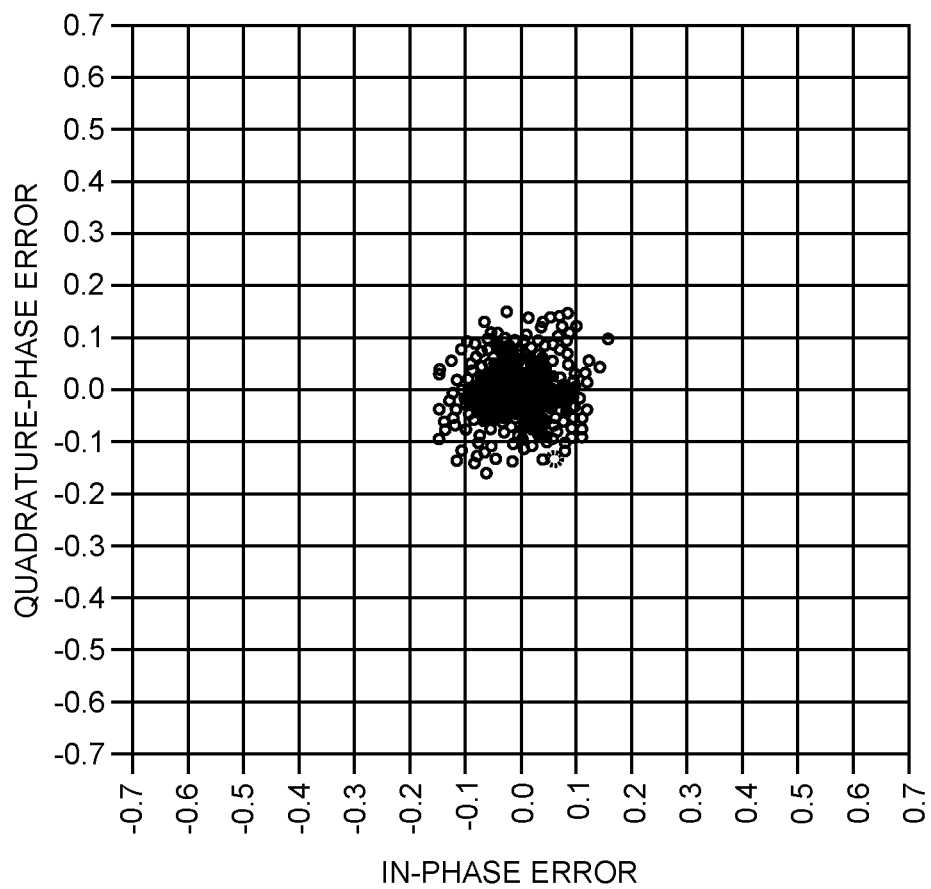
FIG. 3 is a graph of IQ error showing an error vector magnitude of ~2.8% when moving operation of the related-art power amplifier circuitry from 100 MHz to 200 MHz bandwidth.

The power amplifier circuitry and methods of the present disclosure address errors in amplifying wide bandwidth modulation signals using the related-art power cell 10, in this case degraded adjacent channel leakage ratio of −33.7 dBc with error vector magnitude (EVM) of ~2.8% when moving from 100 MHz to 200 MHz bandwidth, as shown in FIG. 2 and FIG. 3, respectively.

FIGS. 4A-4F illustrate the problem of bias shift. On the left are dynamic current-voltage trajectories for all envelope voltages for a driver stage and a final stage of a power amplifier employing the related-art power cell 10. The top trajectories depicted in FIG. 4A and FIG. 4B correspond to an in-phase/quadrature-phase (IQ) magnitude of ~1.08 and a negative slope shown at a marker M1 on the IQ vs. time plot of FIG. 4C and the bottom trajectories depicted in FIGS. 4D and 4E correspond to a roughly equivalent IQ magnitude and a positive slope shown at a marker M2 on the IQ versus time plot of FIG. 4F. The thick black traces represent a dynamic load line for a selected operating point.

Dot-dash reference lines in FIG. 4A and FIG. 4D show minimum and maximum instantaneous collector voltages and collector currents for a driver stage. Similar reference lines are not shown for a final stage because instantaneous errors are negligible relative to the actual currents resulting from the designed bias point/load line. A driver voltage swing is largely unaffected, as is the relative shape of the dynamic load line. However, the bias point is modulated along the current axis by around 5 milliamperes based on the direction of voltage change. These curves are shown for a single-cell in an array, biased around 11 milliamperes. Thus, the 5 milliamperes change is substantial.

Figure 5:
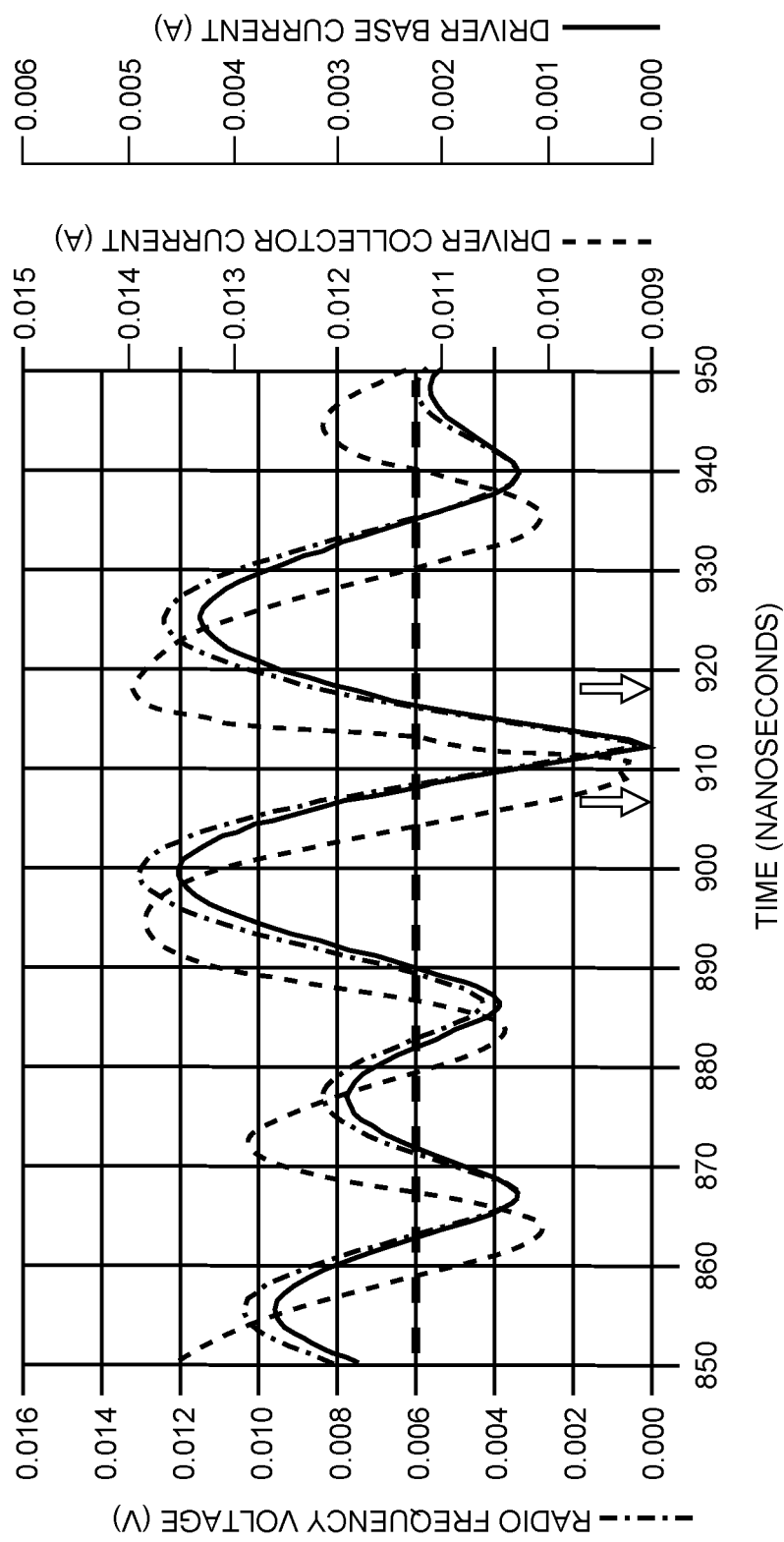
FIG. 5 is a graph illustrating a relationship between envelope magnitude and bias current in the time domain for the related-art power amplifier circuitry.

FIG. 5 is a graph illustrating a relationship between envelope magnitude and bias current in the time domain. A dashed trace represents driver collector current (right Y axis). A thicker dashed line indicates an approximate DC bias point for the power cell 10 (FIG. 1). Two arrows on the time axis show time instances from which the dynamic load lines of FIGS. 4A, 4B, 4D, and 4E were extracted. Driver cell radio frequency (RF) base current (solid curve, second right axis) and RF voltage (dot-dash trace, left axis, roughly equivalent to square root of input power) track the envelope while the DC bias current error (difference relative to the thicker dash line) is roughly zero at envelope peaks and valleys and large along the positive and negative slopes.

The DC bias current error is a result of parasitic base-collector capacitance. As the collector voltage changes, the parasitic base-collector capacitance injects current into the base node of the power cell 10, which is modeled as a heterojunction bipolar transistor (HBT). If the base impedance is zero at baseband frequency, this current is shunted to ground and has a negligible effect on the bias point of the power cell 10. Power cells are isolated from each other using ballast capacitors; however, the impedance at baseband depends on bias circuit output impedance, including ballast resistance, RF coupling capacitance values, and number of cells. If an envelope tracking modulation bandwidth begins approaching RF operating frequency, then other biasing values may begin to affect this impedance as well.

Typically the final stage includes a larger number of cells; thus the base impedance is significantly smaller than that of the driver. This, along with the operating class, is thought to mitigate the amplitude modulation-amplitude modulation by parasitic base-collector capacitance.

Figure 6:
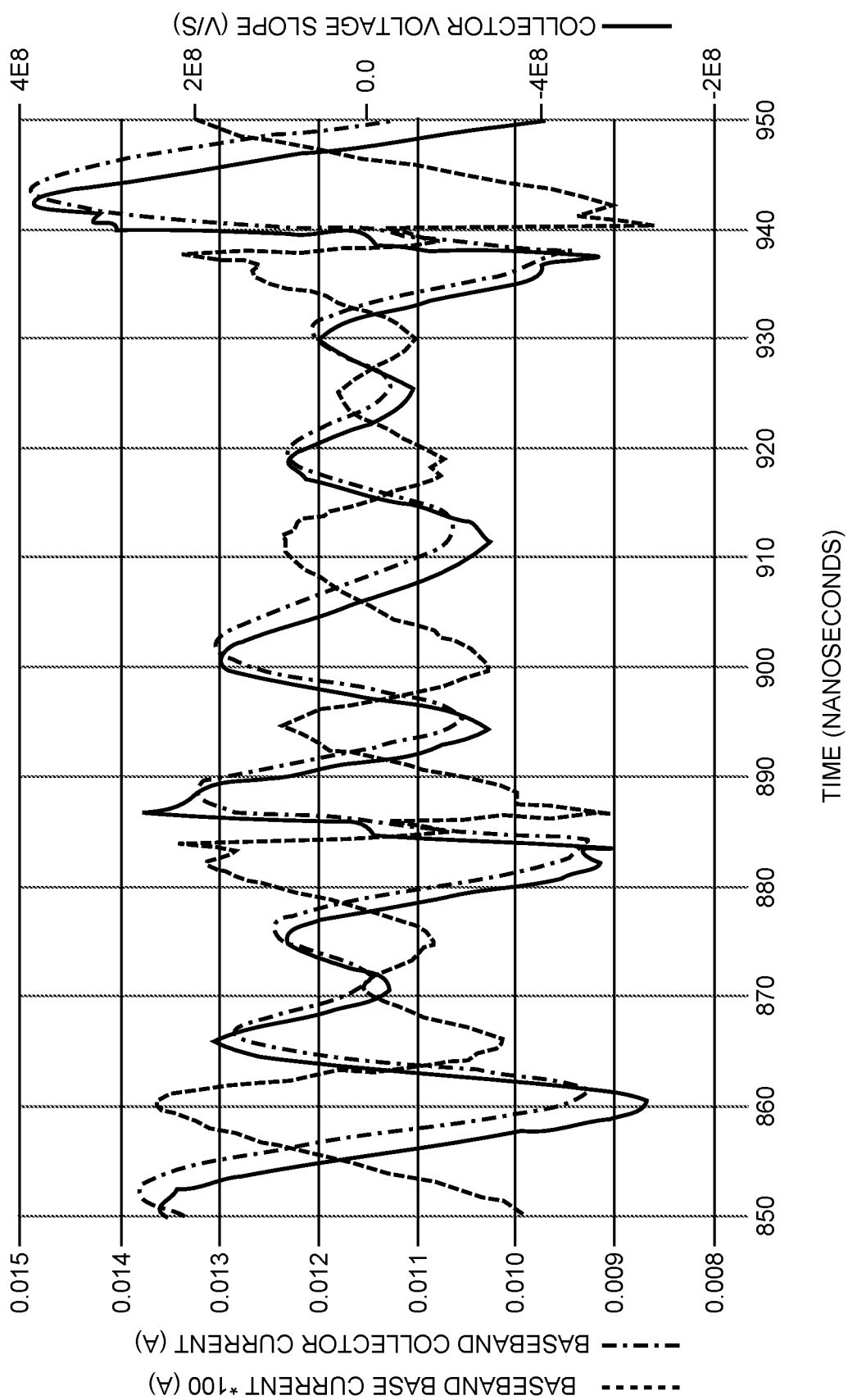
FIG. 6 is a graph with plots that show a correlation between the collector voltage slope and change in baseband collector current.

FIG. 6 is a graph with plots that show a correlation between the collector voltage slope depicted in solid line and change in baseband collector current shown in dot-dash line. The departure from the bias point of 11 milliamperes is highly correlated between these two waveforms.

Figure 7:
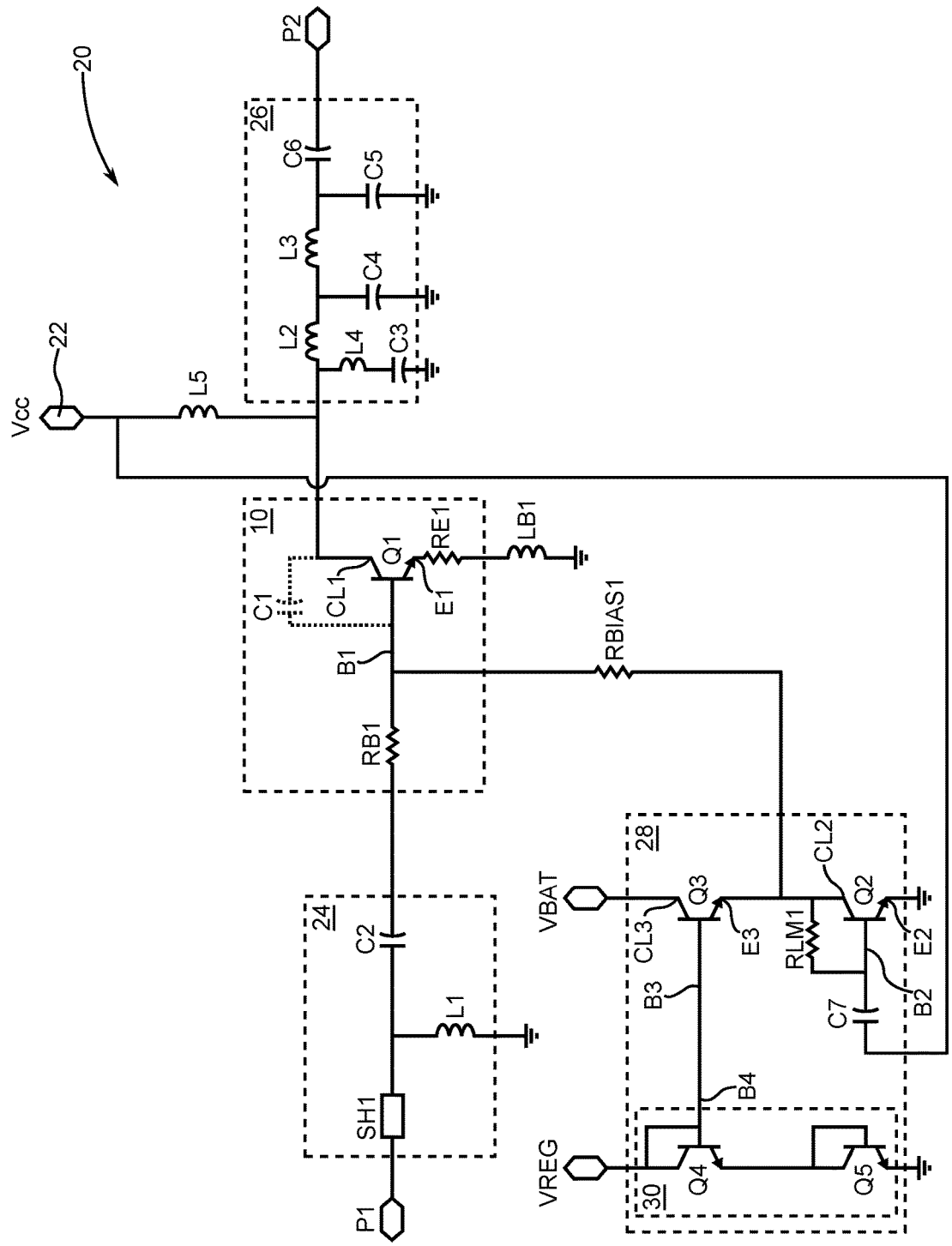
FIG. 7 is schematic of an exemplary embodiment of power amplifier circuitry that is configured to reduce bias shifts in accordance with the present disclosure.

FIG. 7 is a schematic of an exemplary embodiment of power amplifier circuitry 20 that is configured to reduce bias shift errors. The power amplifier circuitry 20 includes the power cell 10, which may be modeled as depicted in FIG. 1. The power cell 10 has a driver transistor Q1 having a first collector CL1 coupled to a modulated supply terminal 22, and a first emitter E1 coupled to ground through a series coupled emitter resistor RE1 and ballast inductor LB1. The driver transistor Q1 may be a bipolar junction power transistor and in some embodiments is a heterojunction bipolar transistor. The driver transistor Q1 also includes a first base B1 that is coupled to an input port P1 through a base resistor RB1 and an input impedance matching network 24. In this exemplary embodiment, the input matching network 24 includes an impedance matching short SH1, a input coupling capacitor C2, and an input matching inductor L1. The first collector CL1 is further coupled to an output port P2 through an output matching network 26, which includes two series inductors L2 and L3, a shunt inductor L4 and three shunt capacitors C3, C4 and C5, and an output coupling capacitor C6. The first collector CL1 is further coupled to the modulated supply terminal 22 through a choke coil L5.

Generally, an envelope voltage Vcc at the modulated supply terminal 22 is directly or indirectly coupled through an offset capacitor C7 to the base B1 of the driver transistor Q1, which must be DC biased. The exemplary embodiment of the power amplifier circuitry 20 depicted in FIG. 7 has the first base B1 indirectly coupled to the modulated supply terminal 22 by way a second transistor Q2. In this case, a second collector CL2 of the second transistor Q2 is DC coupled to the base B1 of the first transistor Q1 through a bias resistor RBIAS1. A second base B2 of the second transistor Q2 is coupled to the modulated supply terminal 22 through the offset capacitor C7. A second emitter E2 is coupled to a fixed voltage node, which in this exemplary embodiment is ground.

The second transistor Q2 and the offset capacitor C7 comprise bias correction sub-circuitry 28, which in this exemplary case further includes a third transistor Q3 that is coupled to the second transistor Q2 in an emitter-follower configuration. The third transistor Q3 has a third collector CL3 that is coupled to a fixed DC voltage such as a battery voltage VBAT. The third transistor Q3 also has a third emitter E3 that is coupled to the second collector CL2.

Moreover, in this exemplary embodiment, the bias correction sub-circuitry 28 further includes a diode stack 30 having two diode-connected transistors Q4 and Q5 coupled between a regulated voltage VREG and ground. A fourth base B4 of the diode-connected transistor Q4 is coupled to the third base B3 of the third transistor Q3. The diode stack 30 generates the reference voltage for the emitter-follower configuration.

The compensation current adds or subtracts directly from the base current Ib. To prevent the compensation current from being absorbed by diode load impedance, the second base B2 and the second collector CL2 may be separated by a limit resistor RLM1 having a resistance value on the order of 1000Ω. However, a substantially larger resistance may generate noise and is not recommended. In some embodiments, the limit resistor RLM1 has a resistance between 500Ω to 2000Ω. In other embodiments, the limit resistor RLM1 has a resistance between 500Ω to 1000Ω. In yet other embodiments, the limit resistor has a resistance between 1000Ω to 2000Ω. Additional circuit structures employing either a diode or a separate transistor in parallel with the emitter-follower are also within the scope of the present disclosure for preventing the compensation current from being absorbed by diode load impedance.

An ideal lookup table voltage is applied in the simulation, but in an actual application filtering of switching noise may be required or a slight delay from envelope to offset current may be desirable depending on whether this circuit is used to compensate a driver stage or another stage later in the amplifier chain and thus has some delay relative to the sensed envelope voltage. This compensation needs to be specifically designed for each power amplifier but in any specific design will provide in accordance with the present disclosure the compensation that is instantaneous and bandwidth insensitive and that requires no outside interaction or calibration.

Calculations to approximate a capacitance value for the offset capacitor C7 required to generate a compensation current ib_offset are given below.

$$i_b = C_{bc} \frac{dV_c}{dt}$$

$i_{b\_offset}$ = desired $ib$ offset current $$i_b = i_{ef} - i_{efl}$$

$$i_{b\_offset} = -\Delta i_{efl}$$

$$\Delta i_{efl} = C_{offset} \cdot \beta \cdot \frac{dV_c}{dt} = C_{bc} \cdot \frac{dV_c}{dt}$$

$$C_{offset} \sim \frac{C_{bc}}{\beta} \quad C_{bc} \sim \frac{0.06 \ pF}{cell}$$

$$C_{offset} \sim \frac{0.06 \cdot cells}{\beta} pF$$

In some embodiments, the offset capacitor C7 has a capacitance within ±10% of a parasitic base-collector capacitance C1 of the bipolar junction power transistor divided by a current gain of the bipolar junction power transistor. Note that the component of the base current Ib error due to the parasitic base-collector capacitance C1 does not exist external to the power cell 24 and is sensed by monitoring resulting voltage changes at a node coupled to the first base B1. The compensation current ib_offset to directly cancel this predominantly flows into the base of the power cell as other paths have large relative impedances. As mentioned earlier, this does not hold in the case envelope tracking modulation bandwidth that approaches RF operating frequencies.

A few benefits of generating the compensation current in this manner are as follows:
1. Bandwidth insensitive: The compensation current is generated in the same manner as the error current and is thus independent of modulation bandwidth.
2. Process variation tolerant: The compensation current is generated through a transistor on the same die as the error current and thus is amplified by the same current gain β (within HBT-to-HBT tolerance within a single die).
3. No outside tuning or calibration is required.

Obviously, design optimization is required any time significant power amplifier design changes occur, such as cell count, ballast resistance, or capacitance modifications.

Figure 8:
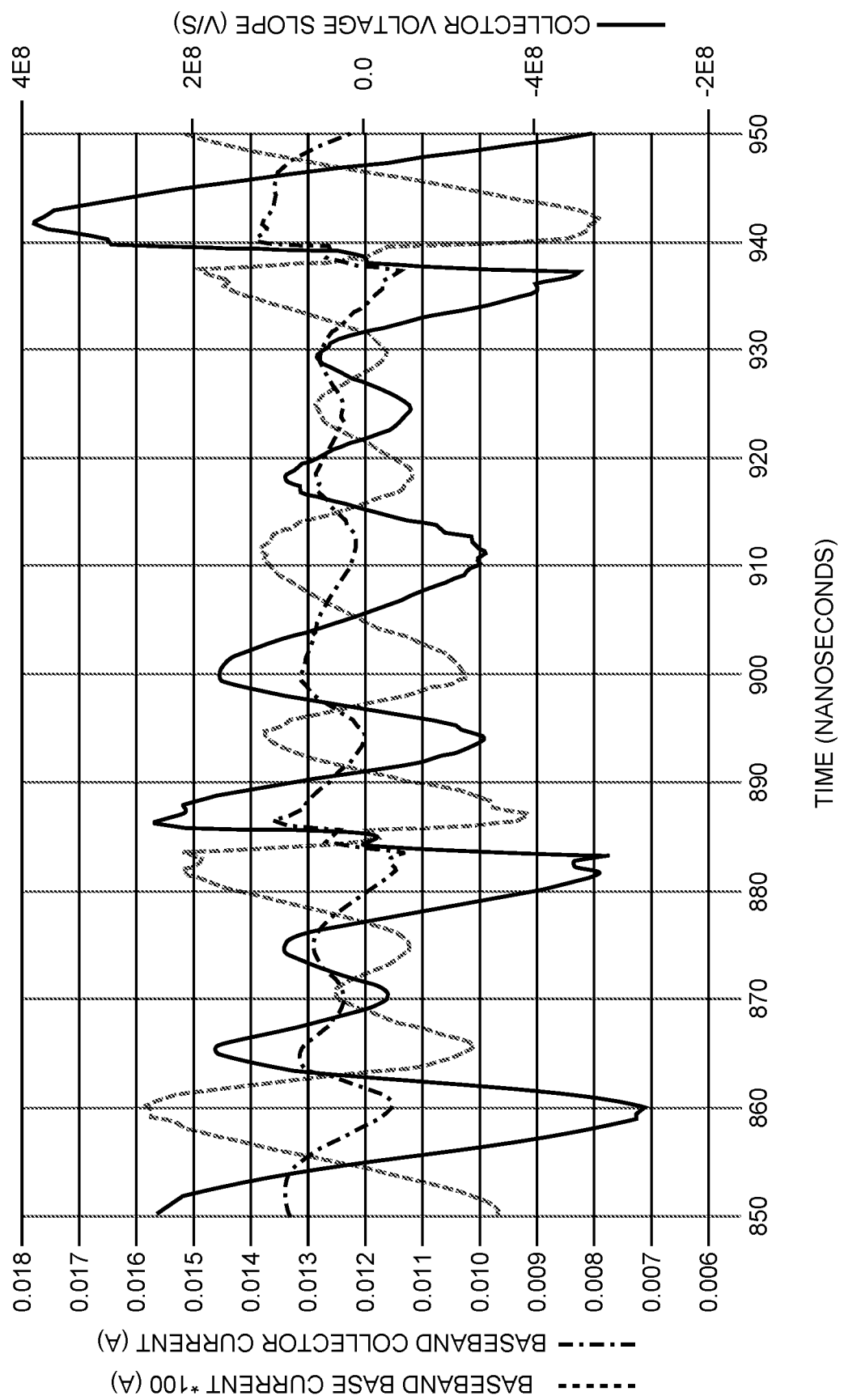
FIG. 8 is a graph that updates the plots of FIG. 6 with error correction provided by the compensation current generated by the bias correction sub-circuitry of the exemplary embodiment of power amplifier circuitry of FIG. 7.
Figure 9C:
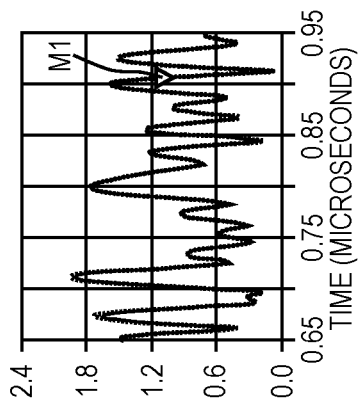
FIGS. 9A-9F are graphs that show the reduction in bias point modulation due to the employment of the bias correction sub-circuitry.
Figure 9F:
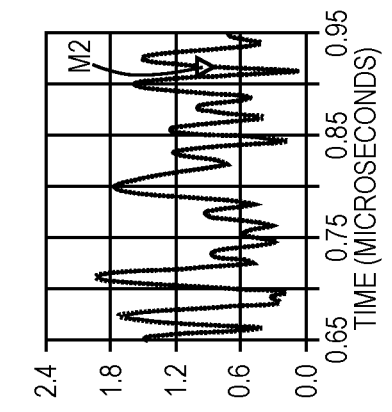
Figure 9B:
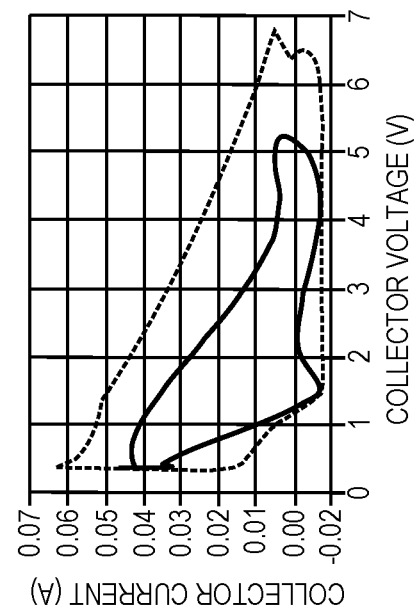
Figure 9E:
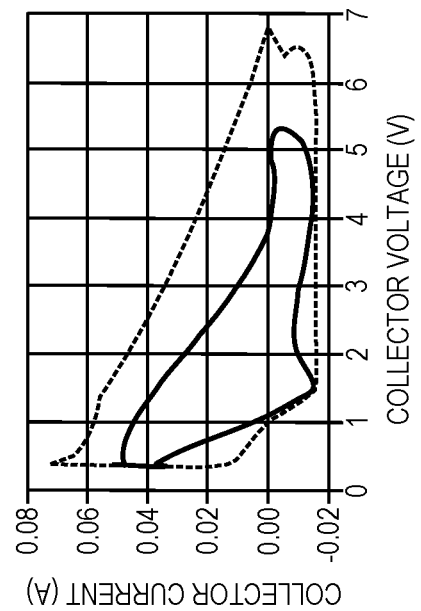
Figure 9A:
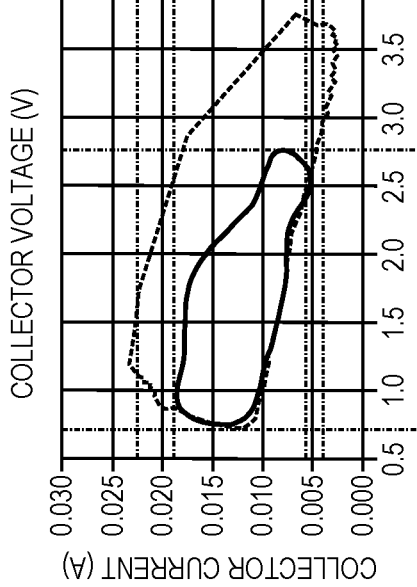
Figure 9D:
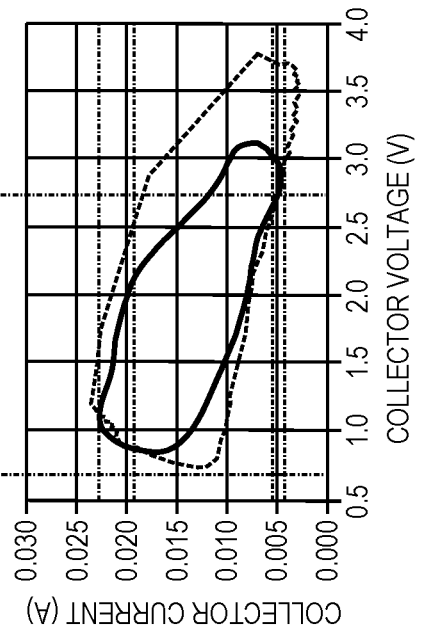

FIG. 8 is a graph that updates the plots of FIG. 6 with error correction provided by the compensation by the bias correction sub-circuitry 28. Observe that peak-to-peak current error is reduced (dot-dash trace is baseband power cell current) significantly from the case with no compensation, from around 6 milliampere peak-to-peak to less than 2 milliampere peak-to-peak.

FIGS. 9A-9F are graphs that show the reduction in bias point modulation due to the employment of the bias correction sub-circuitry 28. There is residual error in this case, but the bias shift relative to uncorrected power cells is significantly reduced.

Figure 10:
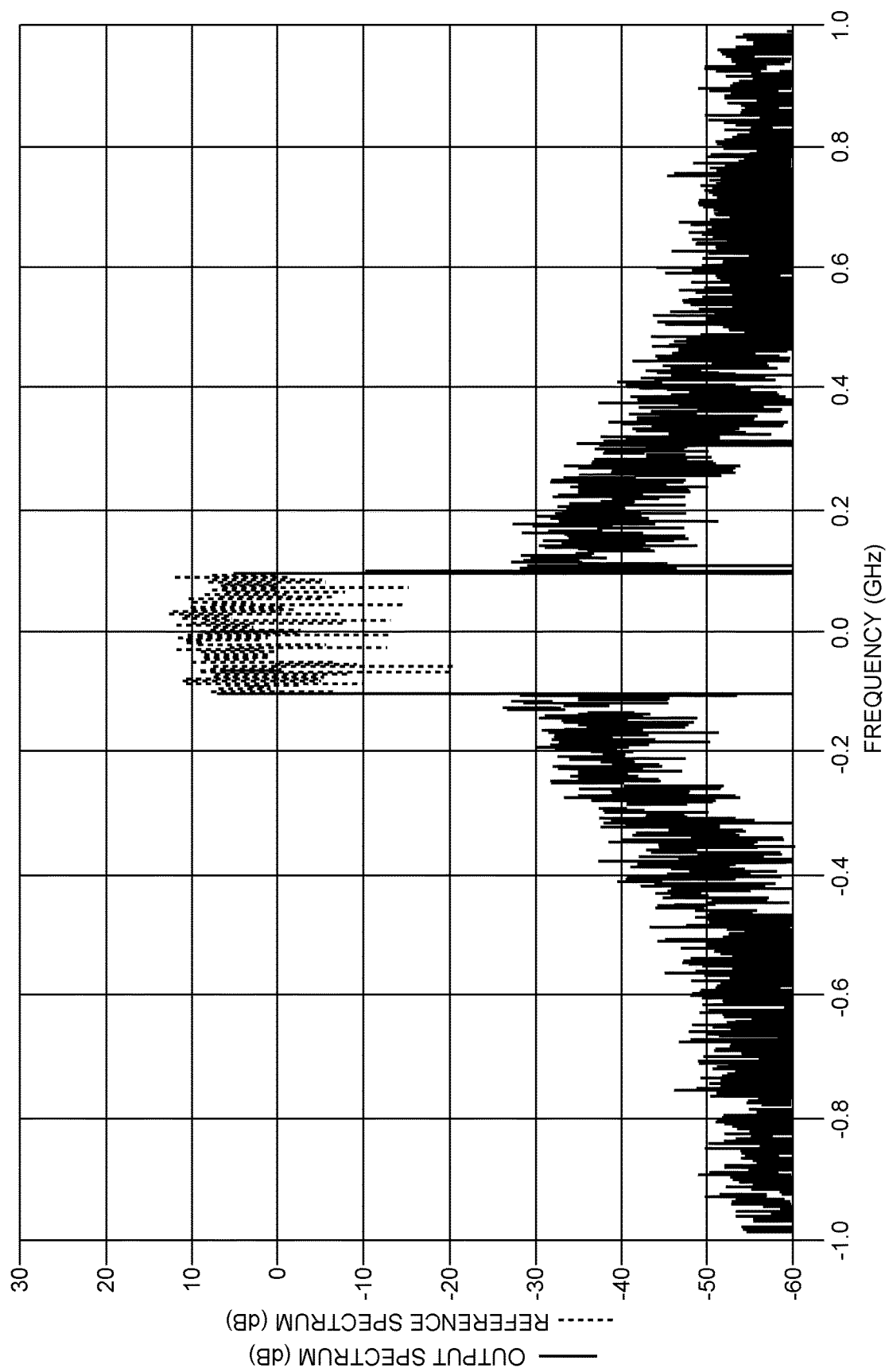
FIG. 10 is a spectrum graph that shows output spectrum results of an envelope tracking simulation of the disclosed power amplifier circuitry with a 200 MHz modulation bandwidth.

FIG. 10 is a spectrum graph that shows output spectrum results of an envelope tracking simulation of the power amplifier circuitry 20 with a 200 MHz modulation bandwidth. The assumptions in this case are ideal lookup table voltages at a module Vcc pin with an accurate power amplifier model: Evaluation Board, module, and die metal co-simulated with finite element method; thermal simulation temperatures of each HBT in a design; and circuit envelope simulation using this particular power amplifier model.

Figure 11:
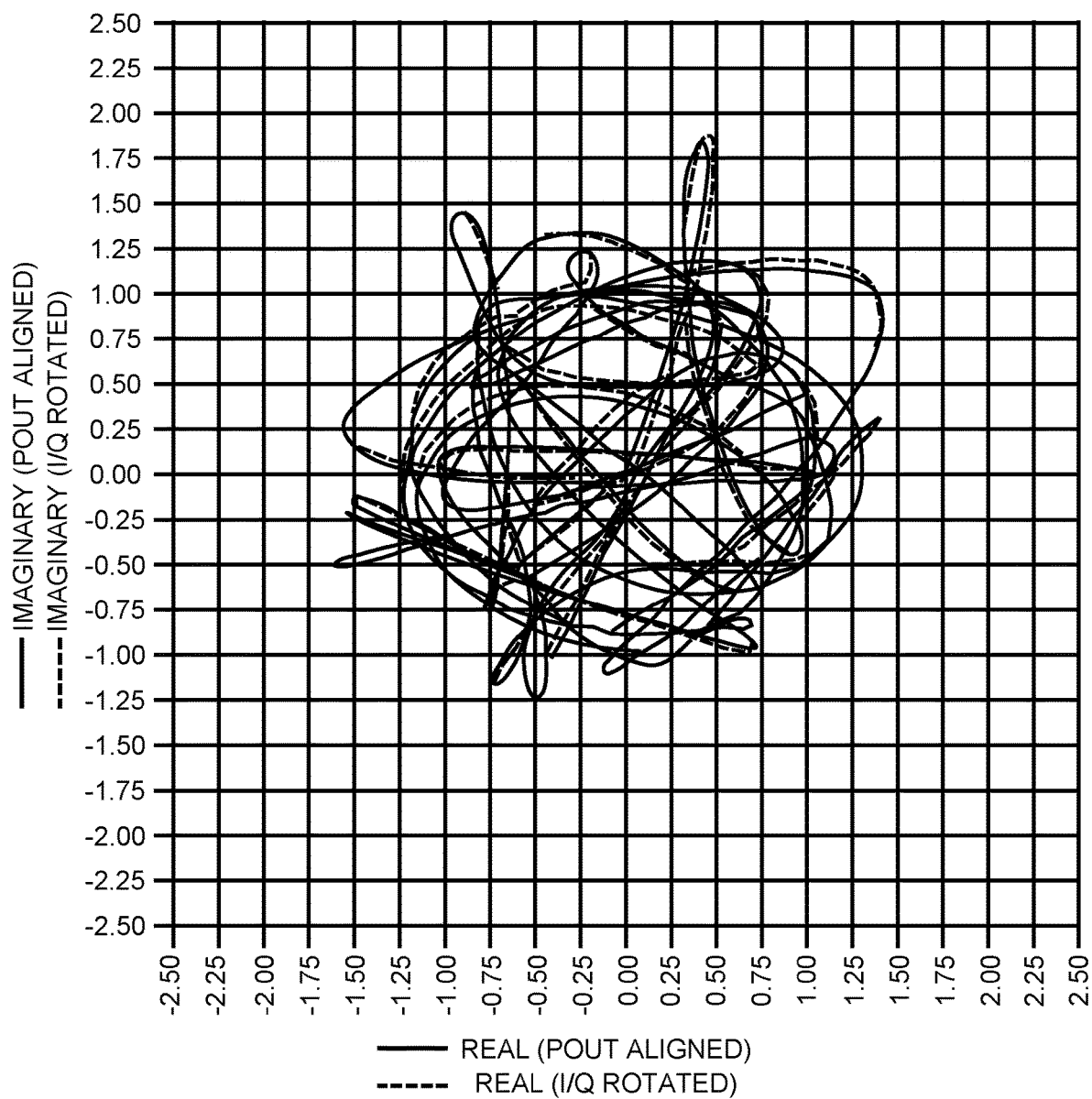
FIG. 11 is a graph of IQ error showing a reduced error vector magnitude when moving operation of the exemplary embodiment of the power amplifier circuitry while in operation between 100 MHz to 200 MHz of bandwidth.

FIG. 11 is a graph of IQ error showing a reduced error vector magnitude when moving operation of the exemplary embodiment of the power amplifier circuitry 20 while in operation between 100 MHz to 200 MHz of bandwidth.

In operation, the bias correction sub-circuitry 28—added EVM is improved to around 1.6%—this is the root mean square error of each individual sample, not true EVM—and adjacent channel leakage ratio is improved to −41.3 dBc. In some embodiments, the bias correction sub-circuitry 28 limits an adjacent channel leakage ratio to between −50 dBc to −40 dBc.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. Power amplifier circuitry comprising:
   a bipolar junction power transistor having a base, a collector, and an emitter; and
   bias correction sub-circuitry configured to generate a compensation current substantially opposite in phase and substantially equal in magnitude to an error current passed by a parasitic base-collector capacitance inherently coupled between the base and collector, wherein the bias correction sub-circuitry has a compensation output coupled to the base and through which the compensation current flows to substantially cancel the error current.

2. The power amplifier circuitry of claim 1 wherein the bipolar junction power transistor is a heterojunction bipolar transistor.

3. The power amplifier circuitry of claim 1 wherein the collector of the bipolar junction power transistor is coupled to a modulated voltage supply terminal.

4. The power amplifier circuitry of claim 3 further including a choke inductor coupled between the modulated voltage supply terminal and collector of the bipolar junction power transistor.

5. The power amplifier circuitry of claim 3 wherein the bias correction sub-circuitry comprises:
a first bias transistor having a first bias collector coupled to the base of the bipolar junction power transistor, and a first bias emitter coupled to a fixed voltage node, and a first bias base; and
an offset capacitor coupled between the modulated voltage supply terminal and the first bias base.

6. The power amplifier circuitry of claim 5 wherein the fixed voltage node is ground.

7. The power amplifier circuitry of claim 5 further including a second bias transistor having a second bias collector coupled to a direct current supply voltage, a second bias emitter coupled to the first bias collector of the first bias transistor to form an emitter-follower configuration.

8. The power amplifier circuitry of claim 7 further including a diode stack configured to generate a reference voltage for the emitter-follower configuration.

9. The power amplifier circuitry of claim 5 wherein the offset capacitor has a capacitance within 10% of a parasitic base-collector capacitance of the bipolar junction power transistor divided by a current gain of the bipolar junction power transistor.

10. The power amplifier circuitry of claim 5 further including a resistor coupled between the first bias collector and first bias base of the first bias transistor.

11. The power amplifier circuitry of claim 10 wherein the resistor has a resistance between 500Ω to 2000Ω.

12. The power amplifier of claim 10 wherein the resistor has a resistance between 500Ω to 1000Ω.

13. The power amplifier of claim 10 wherein the resistor has a resistance between 1000Ω to 2000Ω.

14. The power amplifier circuitry of claim 1 further including an input impedance matching network coupled between an input port and the base of the bipolar junction power transistor.

15. The power amplifier circuitry of claim 1 further including an output impedance matching network coupled between the collector of the bipolar junction power transistor and an output port.

16. The power amplifier circuitry of claim 1 configured to receive a modulated supply voltage.

17. The power amplifier circuitry of claim 16 wherein the modulated supply voltage is modulated at frequencies between 100 MHz to 200 MHz.

18. The power amplifier circuitry of claim 16 wherein the bipolar junction power transistor is configured to output amplified signals with an error vector magnitude of less than 2.0%.

19. The power amplifier circuitry of claim 16 wherein the bias correction sub-circuitry limits an adjacent channel leakage ratio to less than −40 dBc.

20. The power amplifier circuitry of claim 16 wherein the bias correction sub-circuitry limits an adjacent channel leakage ratio to between −33 dBc to −40 dBc.

21. The power amplifier circuitry of claim 16 wherein the bias correction sub-circuitry limits an adjacent channel leakage ratio to between −50 dBc to −40 dBc.

* * * * *